(12) United States Patent
Bhagavat et al.

(10) Patent No.: US 9,287,189 B2
(45) Date of Patent: Mar. 15, 2016

(54) FLEXIBLE ROUTING FOR CHIP ON BOARD APPLICATIONS

(71) Applicant: Broadcom Corporation, Irvine, CA (US)

(72) Inventors: Milind S. Bhagavat, Fremont, CA (US); Javed Iqbal Sandhu, San Ramon, CA (US); Rezaur Rahman Khan, Rancho Santa Margarita, CA (US); Teck Yang Tan, Singapore (SG)

(73) Assignee: Broadcom Corporation, Irvine, CA (US)

( * ) Notice: Subject to any disclaimer, the term of this patent is extended or adjusted under 35 U.S.C. 154(b) by 363 days.

(21) Appl. No.: 13/713,407

(22) Filed: Dec. 13, 2012

(65) Prior Publication Data

US 2014/0124940 A1    May 8, 2014

Related U.S. Application Data

(60) Provisional application No. 61/723,630, filed on Nov. 7, 2012.

(51) Int. Cl.
| | |
|---|---|
| *H01L 23/48* | (2006.01) |
| *H01L 23/52* | (2006.01) |
| *H01L 29/40* | (2006.01) |
| *H01L 23/14* | (2006.01) |
| *H01L 23/31* | (2006.01) |
| *H01L 23/498* | (2006.01) |
| *H01L 23/525* | (2006.01) |
| *H01L 23/528* | (2006.01) |
| *H01L 23/00* | (2006.01) |
| *H01L 25/065* | (2006.01) |

(52) U.S. Cl.
CPC .......... *H01L 23/147* (2013.01); *H01L 23/3114* (2013.01); *H01L 23/49827* (2013.01); *H01L 23/525* (2013.01); *H01L 23/528* (2013.01); *H01L 24/05* (2013.01); *H01L 23/3192* (2013.01); *H01L 24/03* (2013.01); *H01L 24/13* (2013.01); *H01L 24/16* (2013.01); *H01L 25/0655* (2013.01); *H01L 2224/024* (2013.01); *H01L 2224/02335* (2013.01); *H01L 2224/02375* (2013.01); *H01L 2224/0345* (2013.01); *H01L 2224/0346* (2013.01); *H01L 2224/0401* (2013.01); *H01L 2224/05008* (2013.01); *H01L 2224/05568* (2013.01); *H01L 2224/131* (2013.01); *H01L 2224/16225* (2013.01); *H01L 2224/16235* (2013.01); *H01L 2224/16237* (2013.01); *H01L 2924/00014* (2013.01); *H01L 2924/10253* (2013.01); *H01L 2924/10329* (2013.01); *H01L 2924/1431* (2013.01); *H01L2924/1434* (2013.01); *H01L 2924/157* (2013.01); *H01L 2924/15311* (2013.01)

(58) Field of Classification Search
None
See application file for complete search history.

(56) References Cited

U.S. PATENT DOCUMENTS

| | | | | |
|---|---|---|---|---|
| 2003/0071346 | A1* | 4/2003 | Smith et al. | 257/696 |
| 2005/0095880 | A1* | 5/2005 | Macintyre | 439/66 |
| 2006/0160379 | A1* | 7/2006 | Rathburn | 439/66 |

*Primary Examiner* — Evan Pert
*Assistant Examiner* — Shaka White
(74) *Attorney, Agent, or Firm* — Fiala & Weaver P.L.L.C.

(57) ABSTRACT

Methods, systems, and apparatuses for semiconductor devices are provided herein. A semiconductor device includes an array of conductive pads for signals. One or more non-linear compliant springs may be present to route signals from the conductive pads to interconnect pads formed on the semiconductor device to attach bump interconnects. Each non-linear compliant spring may include one or more routing segments. The semiconductor device may be mounted to a circuit board by the bump interconnects. When the semiconductor device operates, heat may be generated by the semiconductor device, causing thermal expansion by the semiconductor device and the circuit board. The semiconductor device and circuit board may expand by different amounts due to differences in their thermal coefficients of expansion. The non-linear compliant springs provide for compliance between the conductive pads and bump interconnects to allow for the different rates of expansion.

20 Claims, 11 Drawing Sheets

FLEXIBLE ROUTING FOR CHIP ON BOARD APPLICATIONS

This application claims the benefit of U.S. Provisional Application No. 61/723,630, filed on Nov. 7, 2012, which is incorporated by reference herein in its entirety.

BACKGROUND

1. Technical Field

The present application relates to integrated circuit interconnection technology.

2. Background Art

Integrated circuit (IC) chips or dies are typically interfaced with other circuits using a package that can be attached to a printed circuit board (PCB). One such type of IC die package is a ball grid array (BGA) package. BGA packages provide for smaller footprints than many other package solutions available today. A BGA package has an array of solder ball pads located on a bottom external surface of a package substrate. Solder balls are attached to the solder ball pads. The solder balls are reflowed to attach the package to the PCB.

An advanced type of BGA package is a wafer-level BGA package. Wafer-level BGA packages have several names in industry, including wafer level chip scale packages (WLCSP), among others. In a wafer-level BGA package, the solder balls are mounted directly to the IC chip when the IC chip has not yet been singulated from its fabrication wafer. Wafer-level BGA packages can therefore be made very small, with high pin out, relative to other IC package types including traditional BGA packages.

A current move to tighter fabrication process technologies, such as 65 nm, with a continuing need to meet strict customer reliability requirements and ongoing cost pressures, is causing difficulties in implementing wafer-level BGA package technology. One challenge to expanding the use of wafer-level BGA packages is the large mismatch between the coefficient of thermal expansion (CTE) between a silicon die and a PCB. A silicon die typically expands very little when heated and a PCB tends to expand much more than the silicon die. Also the mechanical stiffness of the multi-layer PCB is much higher than that of a traditional substrate laminate. The difference in the amounts of thermal expansion can put stress on the solder joints between a wafer-level BGA package and a PCB when the components are thermally cycled, causing joint failure. Because the PCB is stiffer, thermal cycling-related joint failure will typically occur on the silicon die side of the joint. Joint reliability has made it difficult to mount wafer-level BGA packages with silicon dies larger in dimension than 6 mm (e.g., a 6 mm by 6 mm die) to a PCB, because larger dies correspond to a larger absolute thermal expansion mismatch, placing greater stress on the joints.

BRIEF SUMMARY

Methods, systems, and apparatuses are described for a semiconductor die that includes one or more electrically conductive flexible joints routed between the terminals of the die and conductive pads to which interconnects (e.g., solder bumps, etc.) may be mounted, and/or that may be routed between other electrically conductive features of the die, substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

Figure 1:
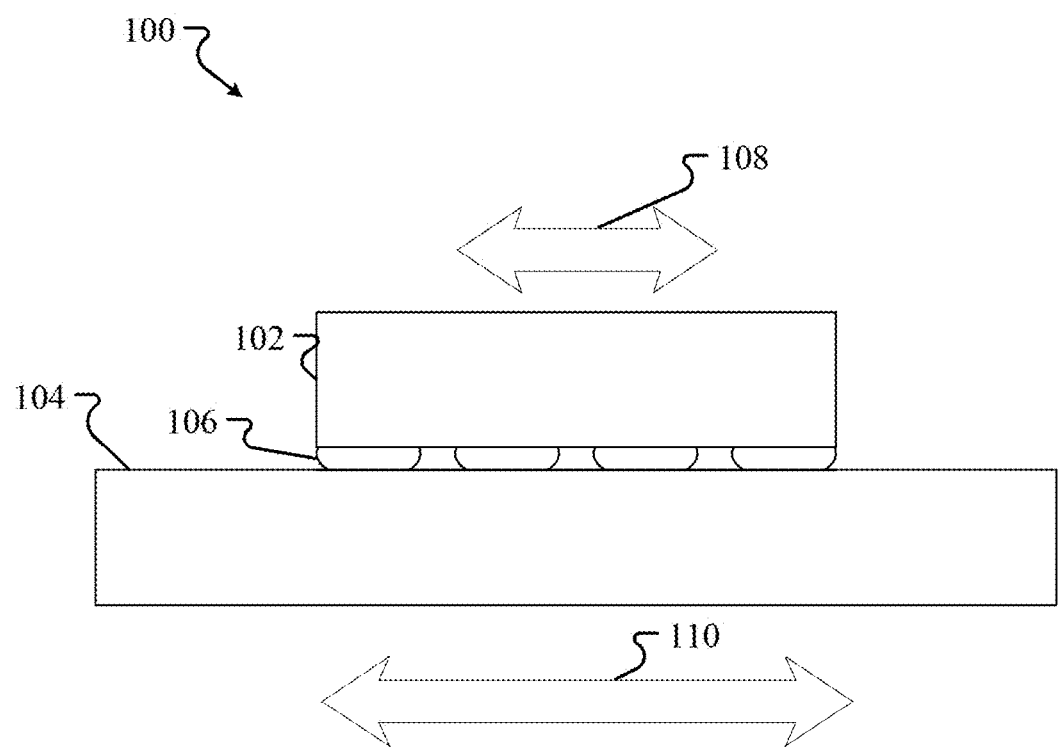
FIG. 1 shows a cross-sectional view of a wafer-level ball-grid array package attached to a circuit board.

Example embodiments will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

Introduction

The present specification discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down,"

"top," "bottom," "vertical," "horizontal," etc.) used herein are for purposes of illustration only, and that practical implementations of the structures described herein can be spatially arranged in any orientation or manner.

The example embodiments described herein are provided for illustrative purposes, and are not limiting. Although described below with reference to flex joints/compliant routing for wafer-level ball grid array (WLBGA) packages, the examples described herein may be adapted to other types of integrated circuit packages, semiconductor devices, and circuit boards. Furthermore, additional structural and operational embodiments, including modifications/alterations, will become apparent to persons skilled in the relevant art(s) from the teachings herein.

Example Embodiments

Embodiments relate to integrated circuit packages, including ball grid array (BGA) packages such as WLBGA (wafer level BGA) packages. For example, FIG. 1 depicts a cross section of a chip-on-board assembly 100, which includes a WLBGA package 102 mounted to a PCB (printed circuit board) 104. WLBGA package 102 is a semiconductor device that includes a silicon chip/die fabricated to include integrated circuitry. WLBGA package 102 is connected to a PCB 104 via a plurality of interconnects, such as an interconnect 106. Interconnect 106 can be any type of interconnect typically used in WLBGA packaging, such a solder ball or bump.

Chip on board assemblies that include WLBGA packages, such as chip on board assembly 100, are undergoing rapid growth in industry due to their many benefits, such as small size, thin profile, low weight, low cost, and low package parasitics. Furthermore, the mobile device industry in particular is driving the demand to integrate larger dies into WLBGA packages. As the desire to integrate increasingly larger dies (e.g., dies that are larger than 6 mm in size) into WLBGA packages, joint reliability must be addressed for such packages.

In chip on board assembly 100, the coefficient of thermal expansion (CTE) of PCB 104 is greater than the CTE of the semiconductor material of WLBGA package 102. PCB 104 therefore thermally expands more than WLBGA package 102 when heated. The difference in thermal expansion distances are represented in FIG. 1 by a WLBGA package expansion arrow 108 and a PCB thermal expansion arrow 110. In FIG. 1, WLBGA package expansion arrow 108 is shorter than PCB expansion arrow 110. A PCB, which is typically multi-layered, has significant mechanical stiffness compared to traditional laminate substrates used in BGA packages, which tends to exaggerate the stress caused by thermal expansion mismatch. Because the distance of thermal expansion is proportional to the dimensions of a material, when WLBGA package 102 is very small (e.g., having a dimension along the plane of contact with PCB 104 that is less than 6 mm), expansion mismatch between arrows 108 and 110 may not be large enough to place excessive stress on interconnect 106. However, when WLBGA package 102 is larger (e.g., over 6 mm in length), the difference in thermal expansion between WLBGA package 102 and PCB 104 can put enough stress on interconnect 106 to cause interconnect 106 to crack and fail.

Embodiments are described herein that overcome these weaknesses in integrated circuit packages, such as WLBGA packages. This is achieved in embodiments by introducing some mechanical compliance between the PCB and the die so as to reduce the damaging effects of thermal mismatch. The compliance is achieved in the routing segment of the silicon die. The routing segment is typically used to connect the bond pad on the die to the solder joint interconnect. For instance, embodiments are described for WLBGA packages with enhanced mechanical (compliance) and thermal characteristics relative to WLBGA package 102 of chip on board assembly 100. In one embodiment, a semiconductor device includes a silicon die, a die pad, at least one routing segment configured as a non-linear compliant spring, and an interconnect pad. The die pad, routing segment, and interconnect pad are electrically conductive. The die pad is positioned on the surface of the silicon die. The routing segment is configured as a non-linear compliant spring in at least one routing layer formed on the silicon die. The interconnect pad is formed at a surface layer of the semiconductor device, and is configured to mount an interconnect member. The routing segment(s) is coupled between the die pad and interconnect pad, with the non-linear compliant spring enabling positional displacement of the interconnect pad relative to the die pad.

As used herein, a non-linear compliant spring is referred to as being non-linear because its stiffness is not constant with planar deformation. This non-linear stiffness is achieved by configuring the length of the non-linear compliant spring to be not straight, even though the non-linear compliant spring may include one or more straight routing segments. The non-linear compliant spring is not straight even though the shortest distance between conductive features (e.g., conductive pads, etc.) that the non-linear compliant spring interconnects is a straight line, and there may be no obstacles (e.g., vias, etc.) to making a straight routing between the conductive features.

Furthermore, the non-linear compliant spring is referred to herein as being compliant because the non-linear compliant spring can flex when a distance between the conductive features that the non-linear compliant spring interconnects changes due to expansion or contraction of a material in which the non-linear compliant spring resides (e.g., due to changes in temperature and/or other forces). Such flexing provides structure resilience to a semiconductor device in which the non-linear compliant spring is included. This may include reducing a stress on solder joints connected between the semiconductor device and a circuit board to which the semiconductor device is mounted resulting from a difference in thermal expansion between the semiconductor device and circuit board (due to non-matching CTEs).

In an example fabrication process, a first electrically insulating layer is formed on a surface of an IC region. The IC region includes at least one conductive pad. A routing segment is formed as a non-linear compliant spring on the first electrically insulating layer. The routing segment is electrically conductive and coupled to a conductive pad through an opening in the first electrically insulating layer. A second electrically insulating layer is formed over the routing segment. An interconnect member is coupled to the routing segment through an opening in the second electrically insulating layer.

In an example aspect of the semiconductor device, an IC package includes an IC die, a die pad, an insulating layer, a routing segment, an interconnect pad, and an interconnect member. The die pad, routing segment, interconnect pad, and interconnect member are electrically conductive. The IC die has a first surface on which the die pad is positioned. An insulating layer is formed on the first surface of the IC die. A routing segment is configured as a non-linear compliant spring in at least one routing layer within an insulating layer on the first surface of the IC die. The routing segment couples the signal between the die pad and the interconnect pad, and is configured to facilitate positional displacement between the interconnect pad relative to a die pad. The interconnect pad is positioned on the surface of the insulating layer, and is connected to the routing segment through the insulating layer.

The interconnect member is attached to the interconnect pad on the surface of the insulating layer.

Figure 2:
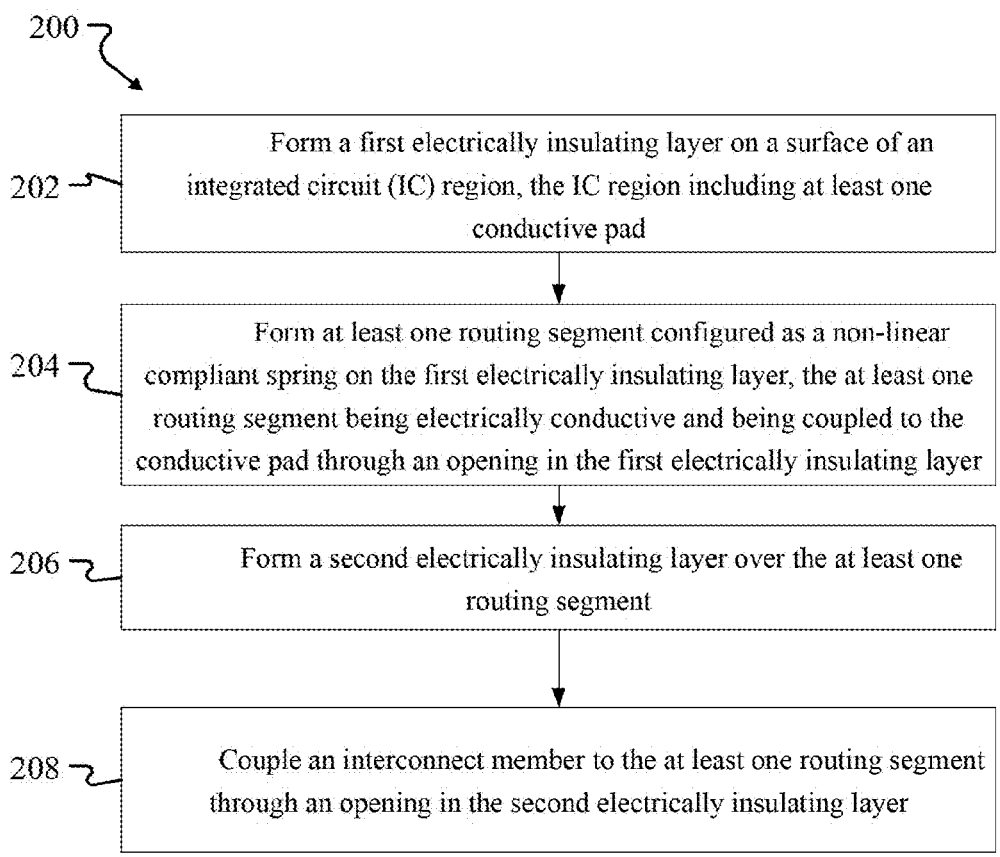
FIG. 2 shows a flowchart providing example steps for forming compliant routing that includes a non-linear compliant spring, in accordance with an example embodiment.

In embodiments, various types of non-linear compliant springs may be formed in semiconductor devices in various ways. For instance, FIG. 2 depicts a flowchart 200 for forming compliant routing that includes a non-linear compliant spring, according to an embodiment of the present application. The non-linear compliant spring is included in an IC package, and enables the IC package to move with respect to a PCB to which the IC package is joined without placing excessive stress on an interconnect joint where the IC package and PCB connect. Note that the steps of flowchart 200 do not necessarily need to be performed in the order shown. Furthermore, it is not necessary to perform all of the steps of flowchart 200 in all embodiments. Flowchart 200 is described below with reference to FIGS. 3-15, for illustrative purposes. Other structural and operational embodiments will be apparent to persons skilled in the relevant art(s) based on the description provided herein.

Figure 3:
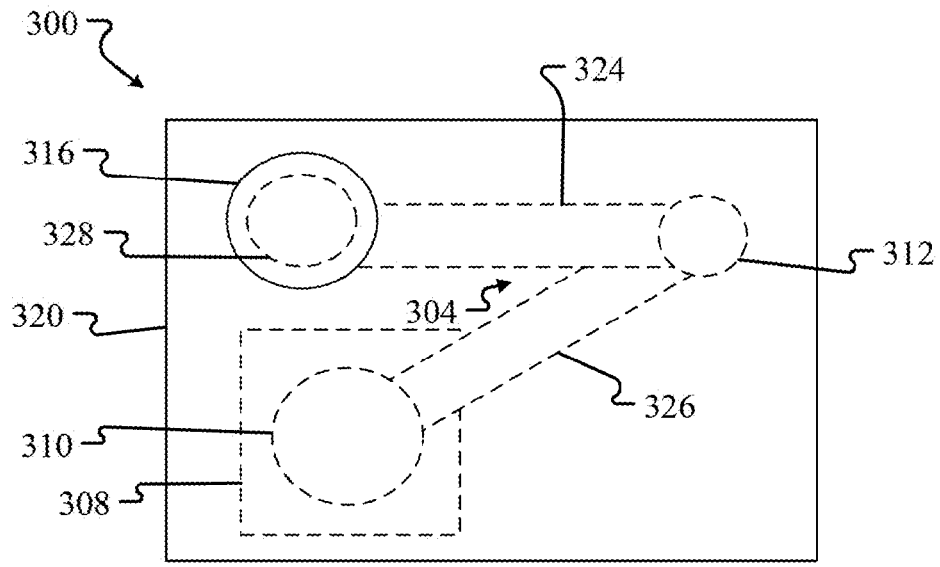
FIGS. 3 and 4 show a top and a cross-sectional view of a semiconductor device that includes single jointed compliant routing formed in a single routing layer, in accordance with an example embodiment.
Figure 4:
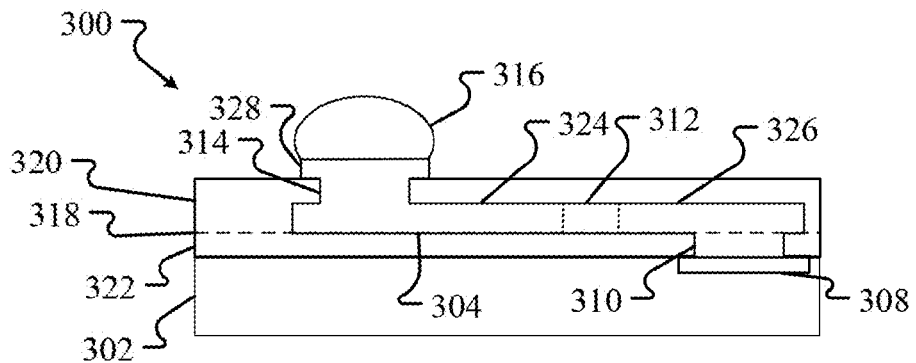

Flowchart 200 begins with step 202. In step 202, a first electrically insulating layer is formed on a surface of an integrated circuit (IC) region, the IC region including at least one conductive pad. For instance, FIGS. 3 and 4 show a top and a cross-sectional view of a semiconductor device 300 that includes single jointed compliant routing formed in a single routing layer, in accordance with an example embodiment. As shown in FIGS. 3 and 4, semiconductor device 300 includes an IC region 302, a die pad 308, a first layer 322 of an insulating material (also referred to as first insulating material layer 322). First layer 322 is formed on a surface of IC region 302 and has a first surface 318, indicated by a horizontal dotted line in FIG. 4.

IC region 302 is a portion of a semiconductor die or chip, which may be included in a wafer (e.g., not yet singulated from the wafer) or separate from a wafer. For instance, IC region 302 may be formed of silicon (doped and/or non-doped) other semiconductor material (e.g., gallium arsenide, etc.). In an embodiment, die pad 308 is present on the surface of IC region 302, and is electrically coupled to an electrical signal in IC region 302. Die pad 308 may be made of any suitable electrically conductive material, including a metal such as copper, aluminum, gold, silver, nickel, tin, titanium, a combination of metals/alloy (e.g., AlCu, etc.), etc. Furthermore, one or more passivation layers may be present on the surface of IC region 302 (e.g., between IC region 302 and first layer 322), and die pad 308 may be exposed through an opening in the passivation layer(s) as a conductive pad (e.g., die pad 308 itself may be exposed through the opening, or a portion of a redistribution layer coupled to die pad 308 may be exposed through the opening).

The insulating material of first layer 322 may be any suitable electrically insulating material, such as a polymer, polyimide, an epoxy, silicone, a dielectric glass, a dielectric material such as a photo-imagable dielectric, and/or other electrically non-conductive material. In an exemplary embodiment, the insulating material of first layer 322 is made from a PBO (polybenzobisoxazole) polymer. First insulating material layer 322 may be applied to the surface of IC region 302 in any manner, conventional or otherwise, as would be known to persons skilled in the relevant art(s). For example, first layer 322 may be applied according to a spin on or dry film process, and subsequently cured/dried, similar to a corresponding wafer-level process. First layer 322 may be formed or processed (e.g., polished) such that it is substantially planar.

Referring back to FIG. 2, in step 204, at least one routing segment is configured as a non-linear compliant spring on the first electrically insulating layer, the at least one routing segment being electrically conductive and being coupled to the conductive pad through an opening in the first electrically insulating layer. For example, semiconductor device 300 of FIG. 4 shows a non-linear compliant spring 304. Non-linear compliant spring 304 is formed on surface 318 of first layer 322, and is connected to die pad 308 of IC area 302 via an electrical conductor through an opening 310 in first layer 322 (the electrical conductor may be considered to be a part of a routing segment of non-linear compliant spring 304).

Non-linear compliant spring 304 may take any form that enables die pad 308 and interconnect pad 314 to be positionally displaced from one another. The displacement can be along an axis parallel to the plane of a routing layer in which at least a portion of non-linear compliant spring 304 is included, which is also parallel to surface 318 (e.g., along a horizontal axis in FIG. 4). The displacement can additionally be along an axis orthogonal to the routing layer (e.g., along a vertical axis in FIG. 4). Alternatively, the non-linear compliant spring 304 can allow simultaneous displacement in both the axis parallel to and orthogonal the routing layer.

In the example of semiconductor device 300 in FIGS. 3 and 4, non-linear compliant spring 304 includes two straight routing segments, a routing segment 324 and a routing segment 326 that are joined by and intersect at a joint 312. Note that in other embodiments, one or both of routing segments 324 and 326 may have other shape than being straight, including being curved, an "S" shape, a zig-zag shape, having one or more bends, etc. In the top view of semiconductor device 300 provided by FIG. 3, routing segments 324 and 326 form an acute angle at joint 312. In embodiments, routing segments 324 and 326 may form any acute angle between 0 and 90 degrees at joint 312. In further embodiments, routing segments 324 and 326 may form a right angle (90 degrees) at joint 312, or may form any obtuse angle between 90 and 180 degrees at joint 312. As shown in FIG. 4, routing segments 324 and 326 and joint 312 are included in a same routing layer of semiconductor device 300.

Note that step 204 of flowchart 200 may include the steps of forming one or more routing layers on layer 322 that each include one or more routing segments of non-linear compliant spring 304. For instance, in the example of FIGS. 3 and 4, a single routing layer may be formed on layer 322 that includes non-linear compliant spring 304 (e.g., includes first and second routing segments 324 and 326 and joint 312). In another embodiment, multiple routing layers (separated by additional electrically insulating layers) may be formed on layer 322 that each include one or more routing segments of non-linear compliant spring 304.

Figure 5:
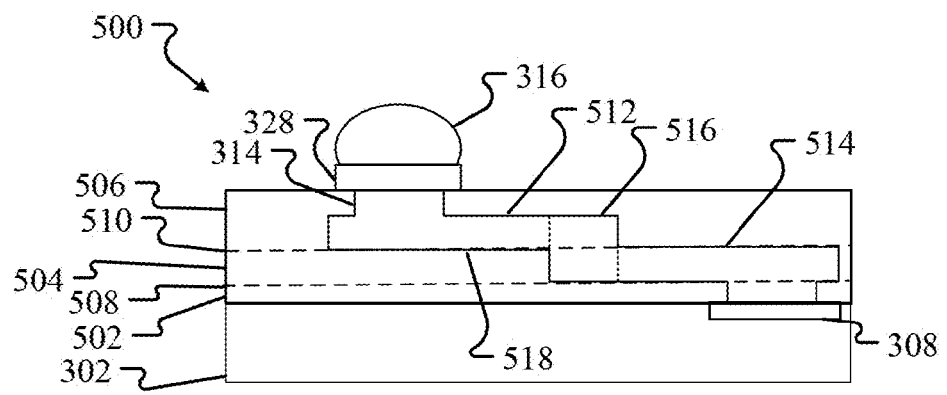
FIG. 5 shows a cross-sectional view of a semiconductor device that includes single jointed compliant routing formed in multiple routing layers, in accordance with an example embodiment.

For instance, FIG. 5 shows a cross-sectional view of a semiconductor device 500 that includes single jointed compliant routing formed in multiple routing layers, in accordance with an example embodiment. As shown in FIG. 5, semiconductor device 500 includes a non-linear compliant spring 518 having routing segments formed in different routing layers. A first layer 502 of insulating material is formed on the surface of IC region 302 (according to step 202 of FIG. 2). A first routing segment 514 of non-linear compliant spring 518 is formed on surface 508 of first layer 502 in a first routing layer, and an intermediate layer 504 of insulating material is formed on the first routing layer. A second routing segment 512 of non-linear compliant spring 518 is formed on a surface 510 of intermediate layer 504. A joint 516 is connected between the first and second routing layers through an opening through intermediate layer 504, and connects first and second routing segments 514 and 512 together. As such, non-linear compliant spring 518 is formed of first routing segment 514 in a first routing layer and second routing segment 512 in a second routing layer that are connected at joint 516.

Thus, in embodiments, non-linear compliant springs can be formed in step 204 that include routing segments in same or different routing layers (e.g., in stacks of alternating routing layers and insulating material layers).

Figure 6:
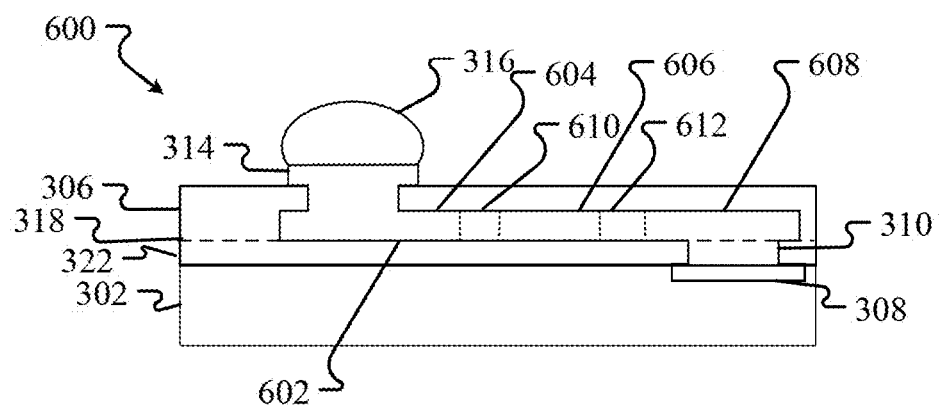
FIGS. 6 and 7 show a top and cross-sectional view of a semiconductor device that includes multi-jointed compliant routing, in accordance with an example embodiment.
Figure 7:
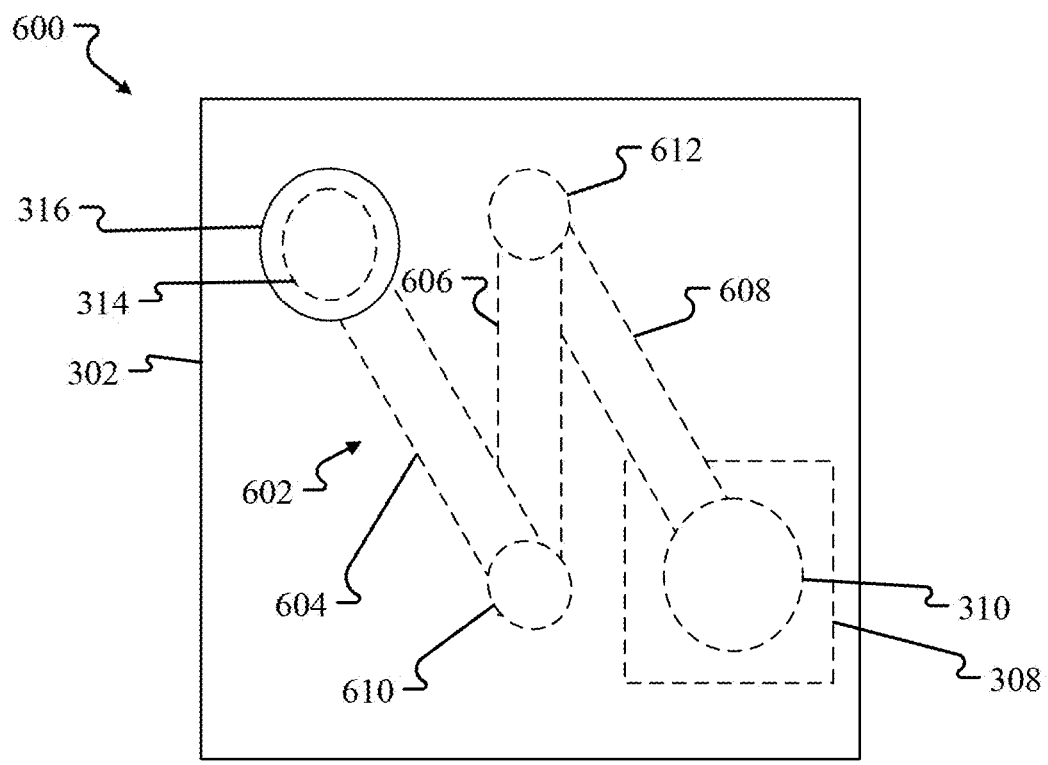

Furthermore, in embodiments, non-linear compliant springs can be formed that include any number of routing segments (e.g., including two routing segments, three routing segments, four routing segments, etc.). For instance, FIGS. 6 and 7 show a top and cross-sectional view of a semiconductor device 600 that includes multi-jointed compliant routing, in accordance with an example embodiment. Semiconductor device 600 is similar to semiconductor device 300 of FIGS. 3 and 4, with semiconductor device 600 containing a non-linear compliant spring 602 that includes three routing segments, first, second, and third routing segments 604, 606 and 608. Semiconductor device 600 is described as follows.

As shown in FIG. 6, routing segments 604, 606 and 608 are included in a same routing layer of semiconductor device 600, which is formed on surface 318 of layer 322. As shown in FIGS. 6 and 7, segments 604 and 606 intersect at and are connected by a first joint 610 and segments 606 and 608 intersect at and are connected by a second joint 612. As such, non-linear compliant spring 602 can flex at first joint 610 and at second joint 612.

Thus, in embodiments, non-linear compliant springs can be formed in step 204 that include any number of routing segments, with each pairs of routing segments in a sequence of routing segments intersecting at a corresponding joint. Such routing segments may be included in a same or in any number of different routing layers, as described above.

In further embodiments, routing segments of non-linear compliant springs may have shapes other than straight. For instance, a routing segment of a non-linear compliant spring may be curvilinear, may be curved, may include one or more bends, may be "s" shaped, may be zigzagged, may include irregularly shaped portions, may have other shapes, and any combination thereof. For example, FIGS. 8-12 show top views of compliant routing having various shapes, in accordance with example embodiments. FIGS. 8-12 are described as follows.

Figure 8:
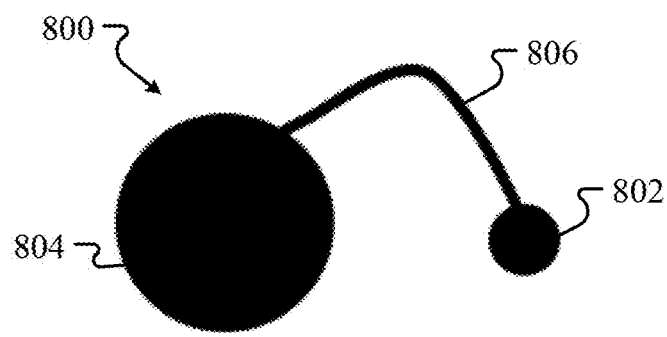
FIGS. 8-12 show top views of compliant routing having various shapes, in accordance with example embodiments.
Figure 9:
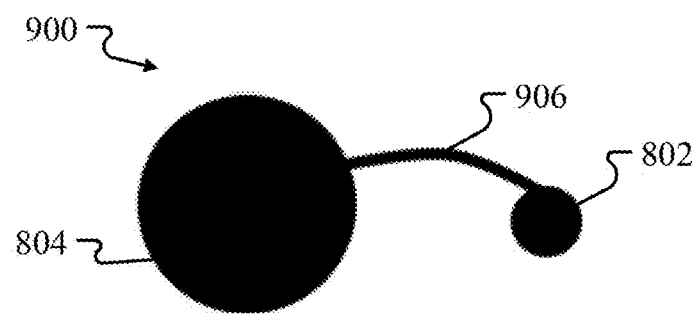
Figure 10:
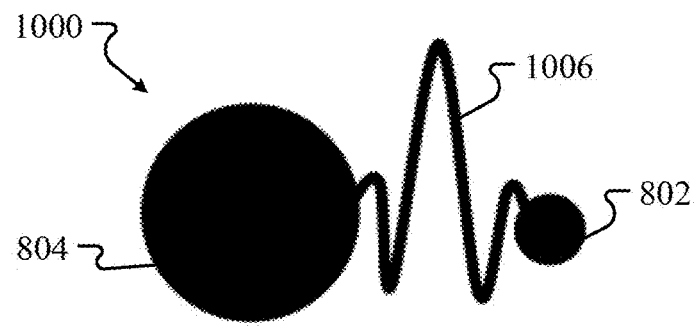
Figure 11:
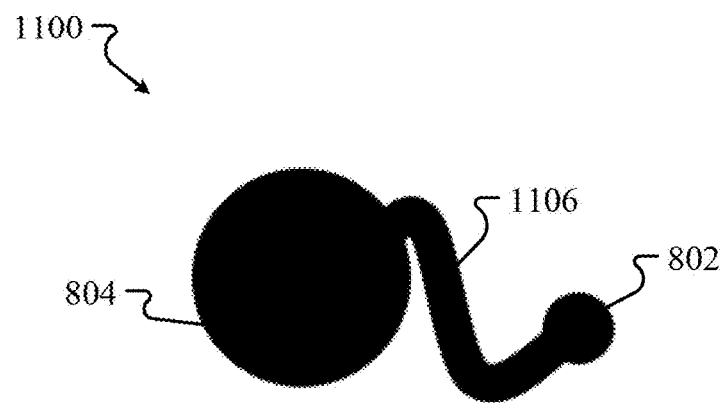
Figure 12:
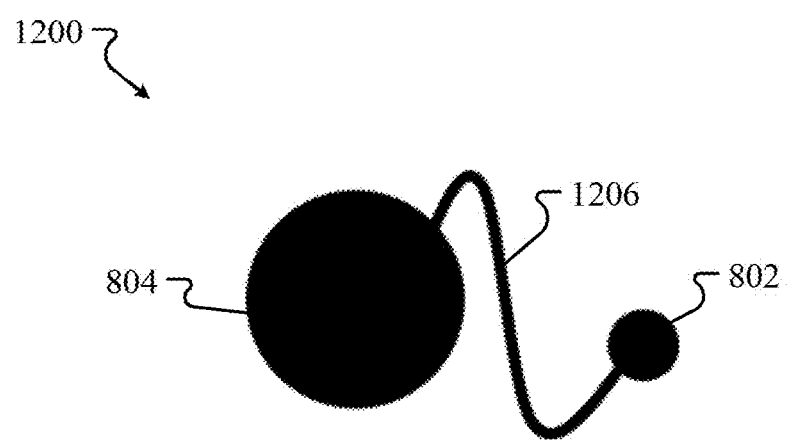

FIGS. 8-12 each depict a different variation of a non-linear compliant spring with a single curved shaped routing segment. FIG. 8 shows a non-linear compliant spring 800 having a routing segment 806, FIG. 9 shows a non-linear compliant spring 900 having a routing segment 906, FIG. 10 shows a non-linear compliant spring 1000 having a routing segment 1006, FIG. 11 shows a non-linear compliant spring 1100 having a routing segment 1106, and FIG. 12 shows a non-linear compliant spring 1200 having a routing segment 1206. Non-linear compliant springs 800, 900, 1000, 1100, and 1200 are each shown connected between a die pad 802 and an interconnect pad 804 in FIGS. 8-12, respectively. Routing segments 806, 906, 1006, 1106, and 1206 each have a substantially constant routing width, and a same routing width (other than routing segment 1106, which is thicker than the other routing segments). Routing segments 806, 906, 1006, 1106, and 1206 each have different curved shapes, however.

For instance, in FIG. 8, routing segment 806 is generally curved to form a substantially right angle between die pad 802 and interconnect pad 804, the curved right angle forming a non-distinct, curved joint between two routing segments included in routing segment 806.

In FIG. 9, routing segment 906 is generally curved to form obtuse angle between die pad 802 and interconnect pad 804, the curved obtuse angle forming a slightly less distinct, curved joint (relative to routing segment 806 of FIG. 8) between two routing segments included in routing segment 906.

In FIG. 10, routing segment 1006 is generally zigzagged shaped, with five joints and six relatively straight routing segments connecting die pad 802 to interconnect pad 804. A first routing segment from die pad 802 connects at a first joint to a first end of a second routing segment that is longer than the first routing segment. The second end of the second routing segment connects at a second joint to the first end of third segment that is longer than the second segment. The second end of the third segment connects at a third joint to the first end of a fourth segment, which is approximately the same length as the third segment. The second end of the fourth segment connects at a fourth joint to the first end of a fifth segment which is approximately the same length as the second segment. The second end of the fifth segment attaches at a fifth joint to a sixth segment that connects to interconnect pad 804, and which is approximately the same length as the first segment. The first, second, third, fourth, fifth and sixth routing segments are connected in series between die pad 802 and interconnect pad 804, with the five distinct joints in between.

In FIGS. 11 and 12, routing segments 1106 and 1206 are substantially "S" shaped. The curves of routing segment 1206 of FIG. 12 are wider than the curves of routing segment 1106 of FIG. 11. Routing segment 1106 is also thicker than the routing segment 1206.

It is noted that the examples of curved routing segments shown in FIGS. 8-10 and 16 are provided for purposes of illustration, and are not intended to be limiting. It will be recognized by person skilled in the relevant art(s) that a myriad of other routing segment shapes are possible. Embodiments are directed to such routing segments shapes.

As described above with reference to FIG. 2, a routing segment formed according to step 204 has a portion (e.g., an end portion) that is coupled to a conductive pad through an opening in the first electrically insulating layer (e.g., coupled to die pad 308 through opening 310 in first layer 322). The opening in the first electrically conductive layer may have straight vertical walls as shown in FIG. 4, may have sloped or tapered walls, or may have other shapes, and may be formed in any manner, including by etching, drilling, etc., as would be known to persons skilled in the relevant art(s).

Non-linear compliant springs 304, 518, 602, 800, 900, 1000, 1100, and 1200 (and further non-linear compliant springs disclosed herein), including routing segments 324 and 326 and joint 312 (and other routing segments and joints disclosed herein), and interconnect pads disclosed herein, may be formed of any suitable electrically conductive material, including a metal such as a solder or solder alloy, copper, aluminum, gold, silver, nickel, tin, titanium, a combination of metals/alloy, etc. Non-linear compliant springs may be formed in a routing layer in semiconductor device 300 in any manner, including according to processes used in standard wafer-level packaging fabrication processes to form routing, such as sputtering, plating, lithographic processes, etc., as would be known to persons skilled in the relevant art(s).

In the embodiments of FIGS. 11 and 12, non-linear compliant springs 1100 and 1200 include interconnect pad 1104, which is octagonal in shape. Die pads, interconnect pads, and other electrical features coupled to non-linear compliant springs may have any suitable shape, including being round, square, rectangular, octagon, etc.

Referring back to FIG. 2, in step 206, a second electrically insulating layer is formed over the at least one routing segment. For instance, in the embodiment of FIG. 4, a second layer 320 of insulating material is formed over surface 318 of first layer 322 and non-linear compliant spring 304. Similarly, in FIG. 5, a second layer 506 of insulating material is formed on surface 510 of intermediate layer 504 and over non-linear compliant spring 518. Second layers 320 and 506 (and other insulating material layers disclosed herein) may each be applied in any manner, conventional or otherwise, as would be known to persons skilled in the relevant art(s). For example, second layers 320 and 506 may be applied according to a spin on or dry film process, similar to a corresponding wafer-level process. The insulating material is applied such that second layers 320 and 506 electrically insulate non-linear compliant springs 304 and 518, respectively. Layers 320 and 506 may be formed or processed (e.g., polished) to be substantially planar. Layers 320 and 506 may be the same material or a different material than first layers 322 and 502. For example, second layers 320 and 506 may each be an electrically insulating material, such as a polymer (for example a PBO polymer), a dielectric material such as a photo-imagable dielectric, and/or other electrically non-conductive material disclosed elsewhere herein or otherwise known. It is noted that the first and second (and any intermediate) insulating material layers of a semiconductor device may be the same insulating material, or may be different insulating materials.

In step 208, an interconnect member is connected to the at least one routing segment through an opening in the second electrically insulating layer. For example, in the embodiment of FIG. 4, interconnect pad 314 is connected through an opening in second layer 320 to routing segment 324 of non-linear compliant spring 304. The opening may have straight vertical walls as shown in FIG. 4 (e.g., may have a cylindrical shape), may have sloped or tapered walls, or may have other shapes. The opening through second layer 320 may be formed in any manner, including by etching, drilling, etc., as would be known to persons skilled in the relevant art(s). With reference to FIG. 5, interconnect pad 314 is similarly connected through an opening in second layer 506 to routing segment 512 of non-linear compliant spring 518.

In addition an additional step to flowchart 200 of FIG. 2, in an embodiment, an under bump metallization (UBM) layer may be formed on an interconnect pad. For example, FIG. 4 (and FIG. 5) shows a cross-sectional view of a UBM layer 328 formed on interconnect pad 314 of non-linear compliant spring 304. UBM layer 328 is typically one or more metal layers formed (e.g., by metal deposition—plating, sputtering, etc.) to provide a robust interface between interconnect pad 314 and a package interconnect mechanism such as a ball interconnect 316 pictured in FIG. 4. A UBM layer serves as a solderable layer for a solder package interconnect mechanism. Furthermore, a UBM provides protection for underlying metal or circuitry from chemical/thermal/electrical interactions between the various metals/alloys used for the package interconnect mechanism. In an embodiment, UBM layer 328 is formed in a similar manner to standard via plating.

In a further embodiment, a ball interconnect may be coupled to each UBM. For example, FIG. 4 shows a cross-sectional view of semiconductor device 300 with a ball interconnect 316 formed on UBM layer 328. In this manner, ball interconnect 316 may be formed in electrical contact with non-linear compliant spring 304. For instance, FIG. 3 shows a top view of semiconductor device 300, where ball interconnect 316 mounted to interconnect pad 328 (indicated by dotted lines) is visible, according to an example embodiment.

An integrated circuit package may have any number of interconnects, such as ball interconnect 316, that are mounted to interconnect pads such as interconnect pad 328. Furthermore, any number of the interconnect pads may have associated non-linear compliant springs to provide compliance between the interconnect pad and a corresponding die pad or other electrical feature of the package.

Figure 13:
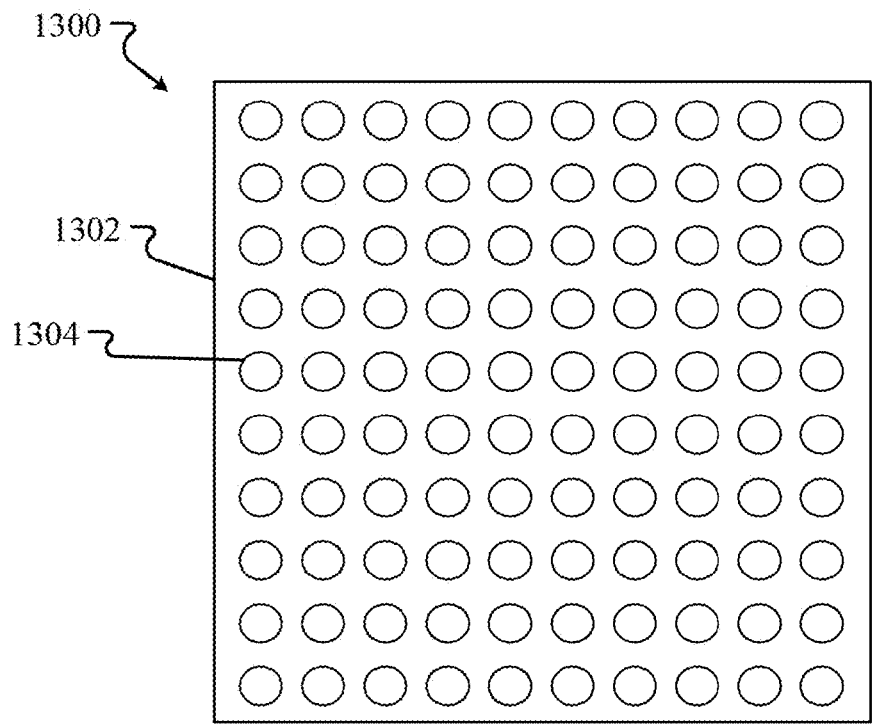
FIGS. 13, 14, 18 and 20 show bottom views of ball grid array packages, in accordance with example embodiments.
Figure 14:
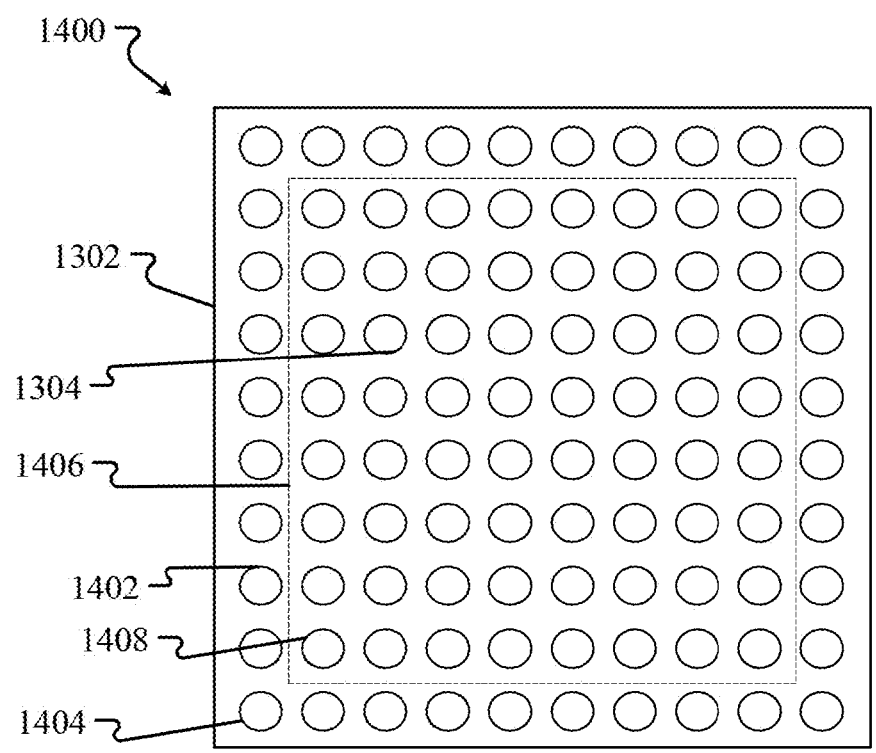

For instance, FIGS. 13 and 14 show bottom views of wafer level ball grid array (WLBGA) packages 1300 and 1400, respectively, in accordance with example embodiments. In FIG. 13, a ball interconnect array 1304 is shown attached to a surface 1302 of WLBGA package 1300. In the example of FIG. 13, ball interconnect array 1304 is a 10 by 10 array of ball interconnects. An array of ball interconnects of any size may be present for wafer-level package 1300, depending on the particular package application. Ball interconnects of array 1304 may be formed of any suitable electrically conductive material, including a metal such as a solder or solder alloy, copper, aluminum, gold, silver, nickel, tin, titanium, a combination of metals/alloy, etc. Ball interconnects of array 1304 may have any size and pitch, as desired for a particular application. Ball interconnects of array 1304 may be any type of ball interconnect, including a solder ball, a solder bump, etc. Ball interconnects of array 1304 may be formed in any manner, including sputtering, plating, lithographic processes, etc., as would be known to persons skilled in the relevant art(s). Ball interconnect array 1304 is used to interface WLBGA package 1300 with an external device, such as a PCB or other type of circuit board.

Any number of the ball interconnects of array 1304 may have associated non-linear compliant springs in package 1300 to provide compliance, including all ball interconnects of array 1304. In some WLBGA packages, it may only necessary to include non-linear compliant springs for the peripheral ball interconnects, because the peripheral joints (formed when the peripheral ball interconnects attach to a circuit board) experience the greatest positional displacement from thermal expansion, and therefore are the most susceptible to failure.

As such, in FIG. 14, ball interconnect array 1304 is shown attached to surface 1302 of WLBGA package 1400. In the example of FIG. 14, ball interconnect array 1304 is a 10 by 10 array of ball interconnects. Furthermore, in the example of FIG. 14, some ball interconnects in ball interconnect array 1304 do not have corresponding non-linear compliant springs in package 1400. Only those ball interconnects located on the outer periphery (e.g., the outermost ring of ball interconnects) of wafer-level package 1400 have associated non-linear compliant springs, as indicated by the area outside of boundary 1406. For example, ball interconnect 1402 is located outside of boundary 1406, and ball interconnect 1404 is located outside of boundary line 1406. Ball interconnects 1402 and 1404 may each be coupled to corresponding non-linear compliant springs in package 1400. In contrast, a ball interconnect 1408, which is located inside boundary 1406, is not coupled to a non-linear compliant spring in package 1400.

Note that non-linear compliant springs described herein may be included in any configuration of integrated circuit package, including IC package 102 of FIG. 1 or other IC package types. For instance, non-linear compliant springs may be included in the integrated circuit die/chip of an integrated circuit package, and/or in other semiconductor device of an integrated circuit package, such as a semiconductor interposer.

Figure 15:
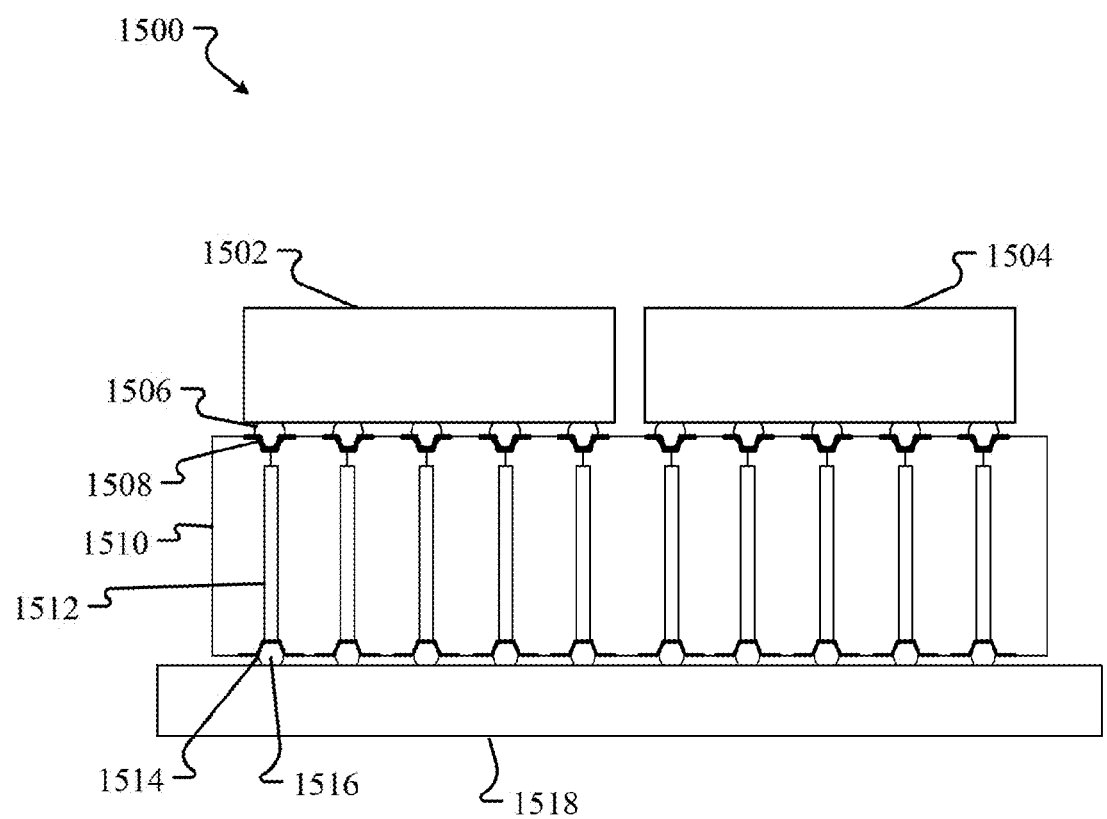
FIG. 15 shows a cross-sectional view of a package with a through silicon interposer that includes compliant routing, in accordance with an example embodiment.

For instance, FIG. 15 shows a cross-sectional view of a package 1500 that includes a through silicon interposer (TSI) 1510 that includes compliant routing, in accordance with an example embodiment. As shown in FIG. 15, package 1500 includes first and second IC dies 1502 and 1504, TSI 1510, and a first array of ball interconnects including a ball interconnect 1516. First and second IC dies 1502 and 1504 are mounted to a first surface of TSI 1510 by a second ball interconnect array (including a ball interconnect 1506) and a third ball interconnect array, respectively, and the first ball interconnect array is attached to interconnect pads at a second surface of TSI 1510 (which is opposed to the first surface of TSI 151). First and second IC dies 1502 and 1504 may each be any type of integrated circuit chips, such as logic chips, memory chips, etc. For instance, first IC die 1502 may be a logic chip, and second IC die 1504 may be a memory chip.

TSI 1510 may include a silicon core layer, with routing and/or other electrical features formed on its first and second surfaces. For instance, first and second arrays of electrically conductive pads may be formed on a first surface of the silicon core layer (at the first surface of TSI 1510) to mount the ball interconnect arrays of first and second IC dies 1502 and 1504. Furthermore, an array of interconnect pads may be formed on a second surface of the silicon core layer (at the second surface of TSI 1510). The interconnect pads may be formed on the second surface of the silicon core layer according to flowchart 200 to include non-linear compliant springs to provide compliance, as described herein.

As shown in FIG. 15, package 1500 is mounted to a PCB 1518 by the first ball interconnect array. TSI 1510 includes electrically conductive pads at its first surface, such electrically conductive pad 1508, for mounting ball interconnects of first and second IC dies 1502 and 1504. TSI 1510 includes a plurality of through vias through its silicon core, including an example through via 1512. The through vias form electrical connections through the silicon core of TSI 1510. As described above, TSI 1510 further includes a plurality of non-linear compliant springs, including an example non-linear compliant spring 1514. The non-linear compliant springs form compliant electrical connections between interconnect pads attaching interconnect balls of the first ball interconnect array at the second surface of TSI 1510, and conductive pads associated with ends of the through vias at the surface of the silicon core of TSI 1510. For instance, a non-linear compliant spring 1514 may be present between a conductive pad associated with through via 1512 and an interconnect pad for ball interconnect 1516. Non-linear compliant spring 1514 may be formed in accordance with flowchart 200. A signal may be conducted from the active surface of die 1502, through ball interconnect 1506, conductive pad 1508, through via 1512, non-linear compliant spring 1514, and ball interconnect 1516, and into PCB 1518. It is noted that there may be myriad ways for signals to travel between die 1502, die 1504, and PCB 1518, as will be understood by those skilled in the art.

As such, package 1500 may be formed to include non-linear compliant springs on a surface of the silicon core of TSI 1510. The non-linear compliant springs enable the silicon core of TSI 1510 to thermally expand by a different amount than PCB 1518 without causing excess stress and failure in the solder joints that attach TSI 1510 to PCB 1518.

Figure 16:
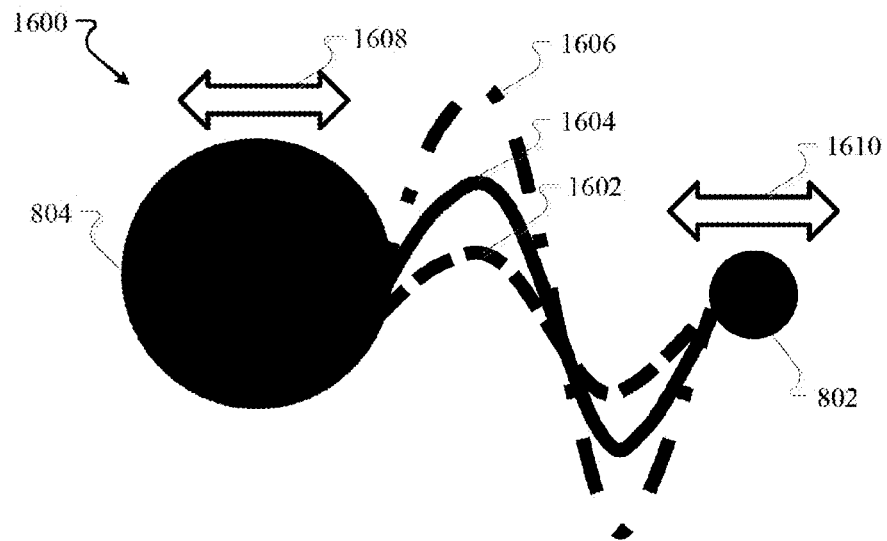
FIG. 16 shows a top view of a die pad and an interconnect pad having curved compliant routing therebetween of three different example curve amplitudes, in accordance with embodiments
Figure 17:
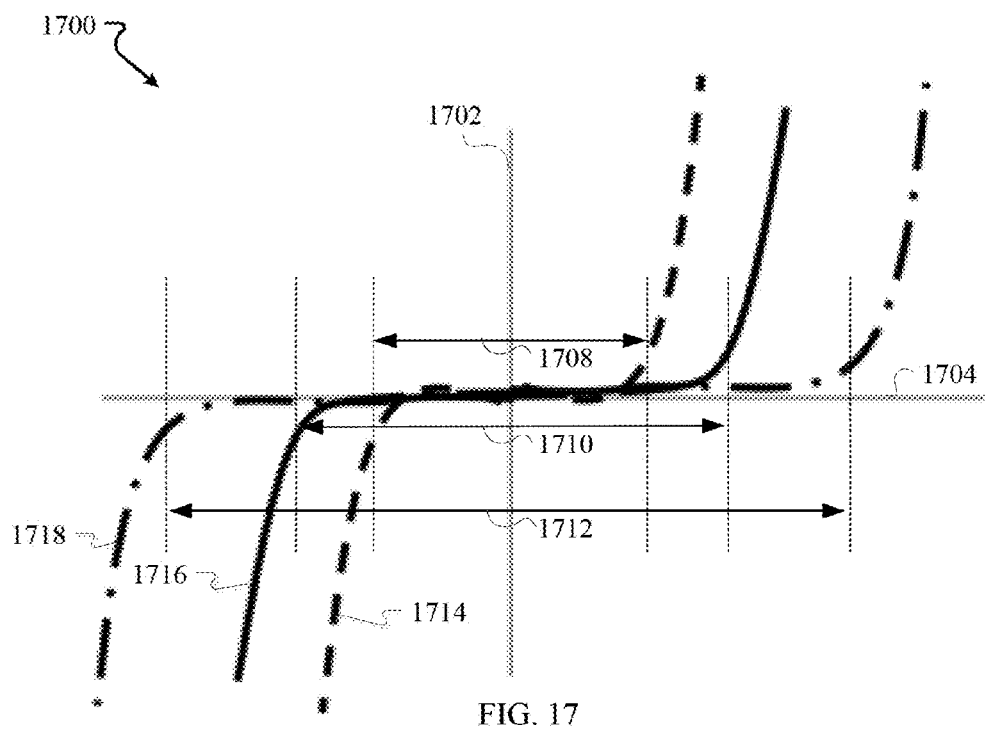
FIG. 17 shows a graph of resistive force as a function of deformation for example compliant routing, in accordance with an example embodiment.

FIGS. 16 and 17 depict example non-linear compliant spring geometries with corresponding force deformation curves. FIG. 16 depicts a non-linear compliant spring 1600 having three example spring geometries superimposed upon one another, in accordance with embodiments herein. Non-linear compliant spring 1600 includes die pad 802 and ball interconnect pad 804, and first, second, and third routing segments 1602, 1604, and 1606, that each may separately connect die pad 802 and ball interconnect pad 804. Routing segments 1602, 1604 and 1606 are each "S" shaped, much like segments 1106 and 1206 of FIGS. 11 and 12 described above, similar to a single cycle of a wave. However, the "wave" shape of each of routing segments 1602, 1604, and 1606 each have a different amplitude. Routing segment 1604 has an "S" curve that is a larger amplitude wave than routing segment 1602. Routing segment 1606 has "S" curve that is a larger amplitude wave than both routing segment 1604 and routing segment 1602. An arrow 1608 is shown in FIG. 16 indicates that ball interconnect pad 804 can move laterally relative to an IC region. An arrow 1610 is shown in FIG. 16 that indicates that die pad 802 can move laterally relative to a PCB.

FIG. 17 shows a graph 1700 of resistive force as a function of deformation for example compliant routing, in accordance with an example embodiment. In graph 1700, a Y axis 1702 represents the resistive force of a spring and an X axis 1704 represents the deformation distance of a spring. The resistive force of a spring is positive above X axis 1704 and is negative below X axis 1704. Similarly, spring deformation is positive to the right of Y axis 1702 (denoting expansion), and spring deformation is negative to the left of Y axis 1702 (denoting contraction). Three plots are superimposed on graph 1700, respectively representing the force-deformation diagram for routing segments 1602, 1604, and 1606. A plot 1714 corresponds to routing segment 1602, a plot 1716 corresponds to routing segment 1604, and a plot 1718 corresponds to routing segment 1606.

The slope of the force-deformation curve at a given deformation point is the stiffness of the spring to deformation at that deformation point. The fact that non-linear features of the force (as a function of spring deformation) can be varied with different parameters of the spring geometry enables tailoring of the spring stiffness. Springs can be designed to be very compliant at small deformations and very stiff at high deformations. The region where the spring changes from being very compliant to very stiff can be changed based on the geometry of the spring.

For example, plot 1714 has a compliance region 1708 (a substantially zero value of resistive force for negative and positive changes in deformation distance) where the stiffness of routing segment 1602 is relatively low and changes little with changes in spring deformation (is substantially constant), corresponding to a resistive force with deformation that is relatively low. Compliance region 1708 includes a range of spring deformation values that span from a negative spring deformation value, through zero to a positive deformation value. Plot 1714 indicates that outside of compliance region 1708, further contracting or expanding routing segment 1602 will produce a very stiff, non-compliant spring response. For instance, in the positive direction along X-axis 1704, after a particular positive value for deformation distance of routing segment 1602 (expansion), resistive force increases exponentially (indicating an increasing resistance to spring expansion). Similarly, in the negative direction along X-axis 1704, after a particular negative value for deformation distance of routing segment 1602 (contraction), a negative value for resistive force decreases exponentially (indicating an increasing resistance to spring contraction). Accordingly, in an embodiment, compliance region 1708 represents a region in which routing segment 1602 may operate most reliably.

A corresponding compliance region 1710 is shown for routing segment 1604 in plot 1716, which is wider along X-axis 1704 than compliance region 1708. As such, routing segment 1604 has a wider range of spring deformation, where the spring stiffness (resistive force) is low and changes little with changes in spring deformation (is substantially constant), relative to routing segment 1602. Because routing segment 1604 has a larger geometry than routing segment 1602 (a higher amplitude curve), routing segment 1604 has a wider compliance region than routing segment 1602. Likewise, plot 1718 has a compliance region 1712 for routing segment 1606 that is even wider than both of compliance regions 1710 and 1708. Compliance region 1712 corresponds to routing segment 1706, which has a larger spring geometry (higher amplitude curve) than routing segments 1702 and 1704. As such, routing segment 1606 has a wider range of spring deformation, where the spring stiffness (resistive force) is low and changes little with changes in spring deformation, relative to routing segments 1602 and 1604.

Figure 18:
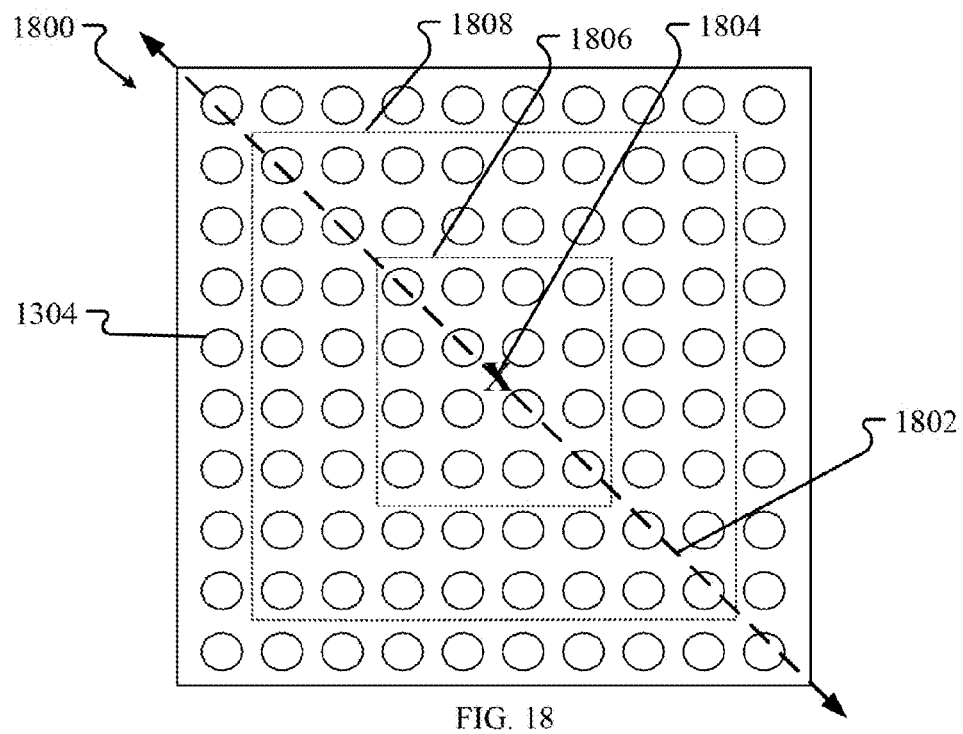

FIG. 18 show bottom view of a ball grid array package 1800, in accordance with example embodiments. FIG. 18 illustrates another variation of compliant spring placement, where the compliance of compliant springs can be further varied according to distance from a center of the die to its periphery. In package 1800, the length of the compliance region of each spring is designed to match the anticipated thermal expansion mismatch between the die and the PCB, as a function of distance from the center of package 1800. Accordingly, regions near the center of package 1800 may have very stiff springs, and those regions further away will have increasingly compliant springs. This enables joints residing near the center of the die out to the periphery of the die to have a relatively uniform stress distribution.

Package 1800 is similar to package 1300 of FIG. 13, including a surfacing having ball interconnect array 1304 having a 10 by 10 array of ball interconnect pads. Package 1800 depicts a diagonal line 1802 running from corner to diagonally opposing corner, in a bias direction across the rows and columns of ball interconnects. The center of diagonal line 1802 is indicated by the "X" located at a center point 1804 of the surface of package 1800. A closest section of package 1800 to center point 1804 (e.g., containing ball interconnects that are no greater than two ball interconnects away from center point 1804) is indicated by a first dotted box 1806 in FIG. 18. An intermediate section of ball interconnects (that contains the third to the fourth ball interconnects away from center point 1804) is contained between the boundaries of first dotted box 1806 and a second dotted box 1808 that surrounds first dotted box 1806. An outermost section of ball interconnects (the outermost ring of ball interconnect pads) resides outside of second dotted box 1808.

Figure 19:
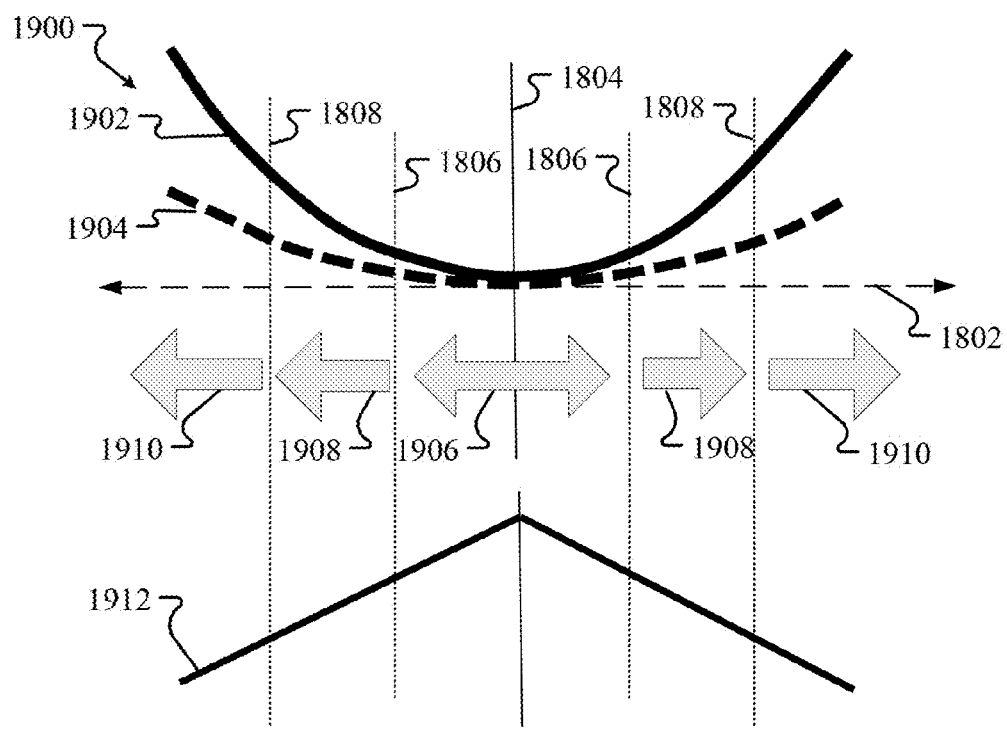
FIG. 19 shows a graph of thermal expansion mismatch and spring stiffness as a function of distance from a center point on a ball grid array package, in accordance with an example embodiment.

FIG. 19 shows a graph 1900 of thermal expansion mismatch and spring stiffness as a function of distance from a center point on a ball grid array package, in accordance with an example embodiment. Graph 1900 depicts both the thermal expansion mismatch between the die and PCB, and the stiffness of the compliant springs located along diagonal line 1802 of package 1800 (FIG. 18). An X axis of graph 1900 indicates a linear dimension defined by diagonal line 1802, showing center point 1804 of diagonal line 1802 at the center of the X axis, and indicating crossing points of first and second dotted boxes 1806 and 1808 by diagonal line 1802. A Y axis of graph 1900 indicates a thermal expansion mismatch between the die and PCB.

Graph 1900 depicts a first curve 1902 representing the unconstrained thermal expansion mismatch between a die pad of an IC region and a ball interconnect pad of a PCB in absence of any joints. Graph 1900 further depicts a second curve 1904 indicating a constrained thermal expansion mismatch between a die pad and a ball interconnect pad, which is enabled by a compliant spring. As shown by curves 1902 and 1904, the amount of expansion mismatch is a minimum at center point 1804 and increases with distance away from center point 1804 in an upwards, parabolic shape. First curve 1902 indicates greater expansion mismatch values than curve 1904, because of the lack of any constraint in the case of curve 1902. Maintaining electrical contact between a die pad of an IC region and a ball interconnect pad of a PCB with no mechanical constraint requires the use of an extremely compliant mechanical spring, which will experience a large amount of deformation. Large amounts of spring deformation can cause shearing and delamination of the insulator films enclosing the routing layers, however. By contrast, a very stiff, non-compliant connection will not allow for differential expansion and result in very high joint stresses. A compromise between the two extremes is desirable. An environment like the one depicted in the thermal expansion mismatch of curve 1904 may be created by including non-linear compliant springs with different levels of compliance in an IC package to reduce the expansion mismatch. A gradated approach to matching thermal expansion mismatch to spring compliance can help ensure that the compliant springs experience minimal deformation while there is still enough flexibility to reduce the joint stress.

As is shown in FIG. 19, different regions of expansion mismatch can be identified and matched to different levels of spring stiffness. In FIG. 18, the closest ball interconnects to center point 1804 experience the least amount of mismatch expansion, and can be found within first dotted box 1806. In FIG. 19, this region is represented by a double-sided arrow 1906 depicting a relatively small amount of expansion immediately around center point 1804. In FIG. 18, the intermediate ball interconnects residing between first and second dotted boxes 1808 and 1806 experience an intermediate level of expansion, represented by arrows 1908 in FIG. 19 pointing outward from dotted box 1806 to dotted box 1808. In FIG. 18, the outermost ball interconnects of package 1800 from center point 1804 reside outside of second dotted box 1808, and experience the largest amount of displacement due to thermal expansion, as represented in FIG. 19 by arrows 1910 pointing outward from dotted box 1808.

The stiffness of the spring used with each ball interconnect of package 1800 can be paired to the level of expansion mismatch. As the expansion mismatch increases, the spring will need to be increasingly compliant, and less stiff. This can be seen in a spring stiffness curve 1912 shown in FIG. 19. Spring stiffness curve 1912 is a pyramid shaped curve that indicates the greatest spring stiffness at center point 1804, and decreasing spring stiffness with increasing distance from center point 1804 along diagonal 1802. A relatively stiff spring may thus be used within the region noted by arrow 1906. A more compliant spring may be used in the intermediate region indicated by arrows 1908. The spring with the greatest compliance may be used in the region indicated by arrows 1910. FIGS. 18 and 19 thereby depict a distribution of non-linear compliant springs that creates a package environment with more uniform joint stress, reducing the joint stress on the corner/outer periphery joints.

In one exemplary embodiment, package 1800 may be a square die with a surface dimension of 8 mm×8 mm. In such an example, package 1800 may have a maximum unconstrained thermal expansion of 8 μm at the periphery. With the introduction of compliant joints between die pads and ball interconnect pads, the compliance regions may be configured as follows: the region within first dotted box 1806 may include one or more springs with high stiffness when deformed beyond 0 μm; the intermediate region inside second dotted box 1808 and outside first dotted box 1806 may feature a spring with high stiffness when deformed beyond 1 μm; and the outermost region outside of second dotted box 1808 may feature a spring with high stiffness when deformed beyond 3 μm.

It will clear to persons skilled in the relevant arts) from the teachings herein that package 1800 may have any size of ball interconnect array in any package shape or configuration. Further expansion regions may be present that are matched with increasingly compliant non-linear springs. A location from which expansion mismatch may be determined for the purpose of configuring compliant and non-compliant springs may be the center point of the package, or any other convenient location.

While it has been noted that the compliance of a non-linear spring may be matched to an anticipated level of thermal expansion mismatch, in some cases it may also desirable to avoid using a compliant spring with a high level of compliance. Springs with higher levels of compliance generally feature larger geometries (covering a larger area), which are more likely to create shearing in the routing layer.

Figure 20:
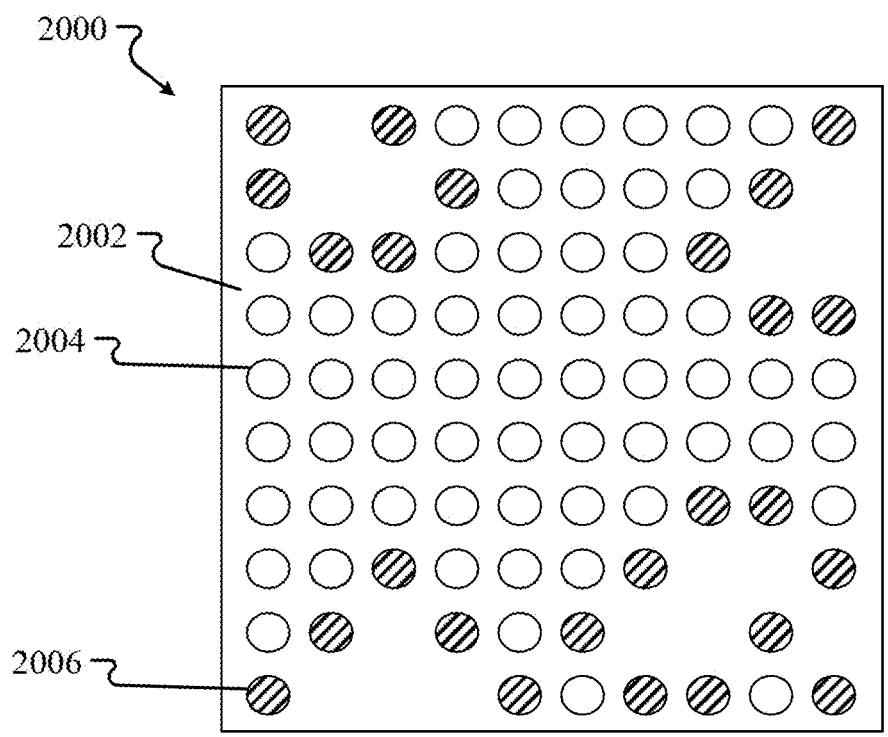

FIG. 20 shows a bottom view of a ball grid array package 2000, in accordance with an example embodiment. In FIG. 20, a surface 2002 of package 2000 is shown. A ball interconnect array 2004 is shown on surface 2002, and a plurality of non-linear compliant springs are integrated in surface 2002 to provide compliance for one of more ball interconnect pads in array 2004. However, in package 2000, a distribution of compliant springs is irregular. As shown in FIG. 20, there are regions of array 2004 where the density of ball interconnect pads is higher, and also several regions of array 2004 that are less dense (or partially unpopulated) because some ball interconnect pads are not present and compliant springs have not been placed. In the higher density regions, the density of ball interconnect pads is above a threshold value, and in the less dense regions the density of ball interconnect pads is below the threshold value. Compliant springs along the periphery of less dense regions of package 2000 are associated with ball interconnect pads denoted by cross hatch marks, including an example peripheral ball interconnect pad 2006. The irregular compliant spring distribution of package 2000 may be desirable for any number of integrated circuit design reasons, including protecting noise sensitive IP blocks on the underlying silicon. The peripheral compliant springs may be susceptible to additional stress because the local density of constraints in these springs is severely reduced. In an embodiment, it may be desirable to use relatively highly compliant springs for peripheral joints to reduce joint stress. In one exemplary example, it may be desirable to use a spring that features high stiffness when deformed beyond 2 μm (or springs with a compliance region of 2 μm). In other embodiments, other levels and ranges of stiffness may be used.

Conclusion

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope should not be limited by any of the above-described exemplary embodiments, but should be defined only in accordance with the following claims and their equivalents.

What is claimed is:

1. A semiconductor device, comprising:
    a silicon die having an electrically conductive die pad;
    at least one routing segment configured as a non-linear compliant spring in at least one routing layer formed on the silicon die, the at least one routing segment being electrically conductive, wherein the non-linear compliant spring comprises a first routing segment and a second routing segment, and wherein the first and second routing segments intersect at a joint and form an acute angle; and
    an electrically conductive interconnect pad formed at a surface layer of the semiconductor device, the interconnect pad configured to mount an interconnect member, the at least one routing segment coupled between the die pad and interconnect pad, and the non-linear compliant spring configured to at least enable compliance to facilitate positional displacement of the interconnect pad relative to the die pad.

2. The semiconductor device of claim 1, wherein the non-linear compliant spring is configured to enable compliance along an axis parallel to a plane of a routing layer formed on the silicon die.

3. The semiconductor device of claim 1, wherein the non-linear compliant spring is configured to enable compliance along an axis orthogonal to a plane of a routing layer formed on the silicon die.

4. The semiconductor device of claim 1, wherein the first and second routing segments are in a same routing layer formed on the silicon die.

5. The semiconductor device of claim 1, wherein the first and second routing segments are in different routing layers formed on the silicon die.

6. The semiconductor device of claim 1, wherein the non-linear compliant spring further comprises:
    at least one additional routing segment that intersects with at least one other routing segment of the non-linear compliant spring at an additional joint to form an additional acute angle.

7. The semiconductor device of claim 1, wherein the non-linear compliant spring comprises:
    a curved routing segment.

8. A method for forming a semiconductor device, comprising:
    forming a first electrically insulating layer on a surface of an integrated circuit (IC) region, the IC region including at least one conductive pad;
    forming at least one routing segment configured as a non-linear compliant spring in at least one routing layer within the first electrically insulating layer, the at least one routing segment being electrically conductive and being coupled to the conductive pad through an opening in the first electrically insulating layer;
    forming a second electrically insulating layer over the at least one routing segment; and
    coupling an interconnect member to the at least one routing segment through an opening in the second electrically insulating layer.

9. The method of claim 8, wherein said forming at least one routing segment configured as a non-linear compliant spring in at least one routing layer within the first electrically insulating layer comprises:
    forming a first routing segment; and
    forming a second routing segment connected to the first routing segment by a first joint;
    wherein the first routing segment and second routing segment form an acute angle.

10. The method of claim 8, wherein said forming at least one routing segment configured as a non-linear compliant spring in at least one routing layer within the first electrically insulating layer comprises:
    forming a first routing segment and a second routing segment in the at least one routing layer on the first electrically insulating layer, the first and second routing segments being coupled together at a first joint, and the first routing segment being connected to the conductive pad through the opening.

11. The method of claim 8, wherein said forming at least one routing segment configured as a non-linear compliant spring in at least one routing layer within the first electrically insulating layer comprises:
   forming a first routing segment in a first routing layer within the first electrically insulating layer, the first routing segment being connected to the conductive pad through the opening;
   forming an intermediate electrically insulating layer on the first routing layer; and
   forming a second routing segment in a second routing layer on the intermediate electrically insulating layer, the second routing segment being electrically coupled to the first routing segment through an opening in the intermediate electrically insulating layer at a first joint.

12. The method of claim 8, wherein said forming at least one routing segment configured as a non-linear compliant spring in at least one routing layer within the first electrically insulating layer comprises:
   forming a curved routing segment within the first electrically insulating layer.

13. The method of claim 8, wherein said forming at least one routing segment configured as a non-linear compliant spring comprises:
   configuring the non-linear compliant spring to have a compliant region where stiffness is substantially constant with spring deformation.

14. An integrated circuit (IC) package, comprising:
   an IC die having a plurality of electrically conductive die pads on a first surface of the IC die;
   at least one electrically insulating layer formed on the first surface of the IC die;
   a plurality of routing segments configured as non-linear compliant springs in at least one routing layer within the at least one electrically insulating layer, the plurality of routing segments being electrically conductive;
   a plurality of first electrically conductive interconnect pads on a surface of the at least one electrically insulating layer, each of the respective plurality of routing segments coupled between a respective die pad of the plurality of die pads and a respective first electrically conductive interconnect pad of the plurality of interconnect pads, and each non-linear compliant spring configured to at least enable compliance to facilitate positional displacement of the respective electrically conductive interconnect pad relative to the respective die pad; and
   a plurality of electrically conductive interconnect members, each respective electrically conductive interconnect member attached to a respective electrically conductive interconnect pad on the surface of the at least one electrically insulating layer, including a respective electrically conductive interconnect member attached to a respective electrically conductive interconnect pad.

15. The IC package of claim 14, wherein the plurality of non-linear compliant springs are configured to enable compliance along an axis parallel to a plane of a routing layer within the at least one electrically insulating layer.

16. The IC package of claim 15, wherein the plurality of non-linear compliant springs further comprise:
   a centrally located first set of non-linear compliant springs configured to have a first stiffness; and
   a peripherally located second set of non-linear compliant springs configured to have a second stiffness, the first stiffness being greater than the second stiffness.

17. The IC package of claim 15, wherein the plurality of non-linear compliant springs further comprise:
   a centrally located first set of non-linear compliant springs configured to have a first compliance region corresponding to a first spring deformation region;
   an intermediately located second set of non-linear compliant springs configured to have a second compliance region corresponding to a second spring deformation region, the second spring deformation region being wider than the first spring deformation region; and
   an outermost located third set of non-linear compliant springs configured to have a third compliance region corresponding to a third spring deformation region, the third spring deformation region being wider than the second spring deformation region.

18. The IC package of claim 15, wherein the plurality of non-linear compliant springs further comprise:
   a first set of non-linear compliant springs located in one or more high density regions of the IC package configured to have one or more first compliance regions corresponding to one or more first spring deformation regions, the one or more high density regions having one or more densities of interconnects over a threshold value; and
   a second set of non-linear compliant springs located peripherally around one or more low density regions of the IC, the low density regions having a density of interconnects below a threshold value, the second set configured to have a second compliance region corresponding to a second spring deformation region, the second spring deformation region being wider than the one or more first deformation regions of high compliance.

19. The IC package of claim 15, wherein each non-linear compliant spring is configured to have a compliant region where stiffness is substantially constant with spring deformation.

20. The semiconductor device of claim 1, wherein the non-linear compliant spring is configured to have a compliant region where stiffness is substantially constant with spring deformation.

\* \* \* \* \*